(12) United States Patent
Ku et al.

(10) Patent No.: US 9,349,599 B1
(45) Date of Patent: May 24, 2016

(54) METHOD FOR FABRICATING SEMICONDUCTOR DEVICE

(71) Applicant: UNITED MICROELECTRONICS CORP., Hsin-Chu (TW)

(72) Inventors: Chih-Feng Ku, Taichung (TW); Shao-Wei Wang, Taichung (TW); Yi-Hui Lin, Changhua County (TW); Tsai-Yu Wen, Tainan (TW); Tsuo-Wen Lu, Kaohsiung (TW); Yu-Ren Wang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/537,827

(22) Filed: Nov. 10, 2014

(51) Int. Cl.
*H01L 21/28* (2006.01)
*H01L 29/66* (2006.01)

(52) U.S. Cl.
CPC ...... *H01L 21/28176* (2013.01); *H01L 29/6653* (2013.01)

(58) Field of Classification Search
CPC ..................... H01L 21/28176; H01L 29/6653
See application file for complete search history.

(56) References Cited

U.S. PATENT DOCUMENTS

| 2003/0211682 A1* | 11/2003 | Jenq ............... H01L 21/28088 438/216 |
| 2008/0303069 A1* | 12/2008 | Fuller ............. H01L 21/28035 257/288 |
| 2012/0184110 A1 | 7/2012 | Hirose et al. |

* cited by examiner

*Primary Examiner* — Duy Deo
(74) *Attorney, Agent, or Firm* — Winston Hsu; Scott Margo

(57) ABSTRACT

A method for fabricating semiconductor device is disclosed. The method includes the steps of: providing a substrate having gate structure thereon, wherein the gate structure comprises a high-k dielectric layer; increasing an ambient pressure around the gate structure to a predetermined pressure by injecting a first gas; reducing the ambient pressure to a base pressure; and forming a spacer around the gate structure.

17 Claims, 3 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of increasing ambient pressure around gate structure by introducing low activity gas before spacer formation.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

In current fabrication of high-k metal transistor, spacer formation is typically accomplished by using furnace to deposit dielectric layer such as silicon carbon nitride along with a temperature ramp approach before etching back the dielectric layer for forming spacer. Devices obtained through this approach however still reveal unsatisfactory current leakage result. Hence, how to improve the current fabrication for fabricating high-k metal gate transistor has become an important task in this field.

SUMMARY OF THE INVENTION

According to a preferred embodiment of the present invention, a method for fabricating semiconductor device is disclosed. The method includes the steps of: providing a substrate having gate structure thereon, in which the gate structure includes a high-k dielectric layer; increasing an ambient pressure around the gate structure to a predetermined pressure by injecting a first gas; reducing the ambient pressure to abase pressure; and forming a spacer around the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
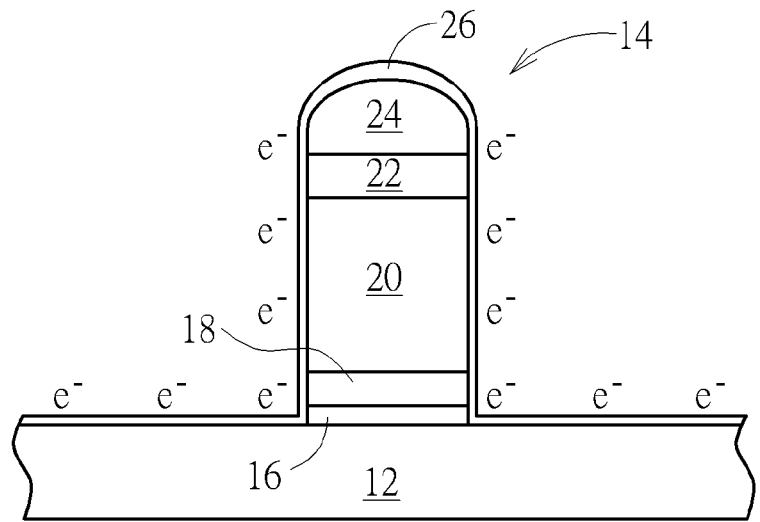
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a wafer or silicon-on-insulator (SOI) substrate is provided, in which a plurality of shallow trench isolations (STIs) (not shown) could be formed in the substrate 12.

A gate structure 14 is then formed on the substrate 12 by first depositing an interfacial layer (not shown), a high-k dielectric layer (not shown), a silicon layer (not shown), a first hard mask layer (not shown), and a second hard mask layer (not shown) on the substrate 12. A patterned transfer is conducted thereafter by forming a patterned mask, such as a patterned resist (not shown) on the second hard mask layer, and a dry etching process is conducted by using the patterned resist to remove part of the second hard mask layer, part of the first hard mask layer, part of the silicon layer, part of the high-k dielectric layer, and part of the interfacial layer for forming a gate structure 14. In other words, the gate structure 14 is preferably composed of a patterned interfacial layer 16, a patterned high-k dielectric layer 18, a patterned silicon layer 20, a patterned first hard mask 22, and a patterned second hard mask 24.

In this embodiment, the interfacial layer 16 is preferably composed of silicon material such as silicon dioxide ($SiO_2$), silicon nitride (SiN), or silicon oxynitride (SiON), or other dielectric material with high permittivity or dielectric constant. The silicon layer 20 is preferably composed of single crystal silicon, doped polysilicon, or amorphous polysilicon, the first hard mask 22 is composed of silicon nitride, and the second hard mask 24 is composed of silicon oxide. Despite the hard mask of this embodiment is a two-layered structure, the hard mask could also be a single-layered structure selected from the group consisting of SiC, SiON, SiN, SiCN and SiBN, which is also within the scope of the present invention.

As the present embodiment pertains to a high-k first process from gate last process, the high-k dielectric layer 18 preferably has a "I-shaped" cross section and preferably be selected from dielectric materials having dielectric constant (k value) larger than 4. For instance, the high-k dielectric layer 20 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

After the gate structure 14 is formed, a wet etching process or a wet clean is conducted to remove residues or particles on the substrate 12, and at this stage, a native oxide 26 is also grown naturally on the surface of substrate 12 and gate structure 14 along with electron charges after the wet clean.

Figure 2:
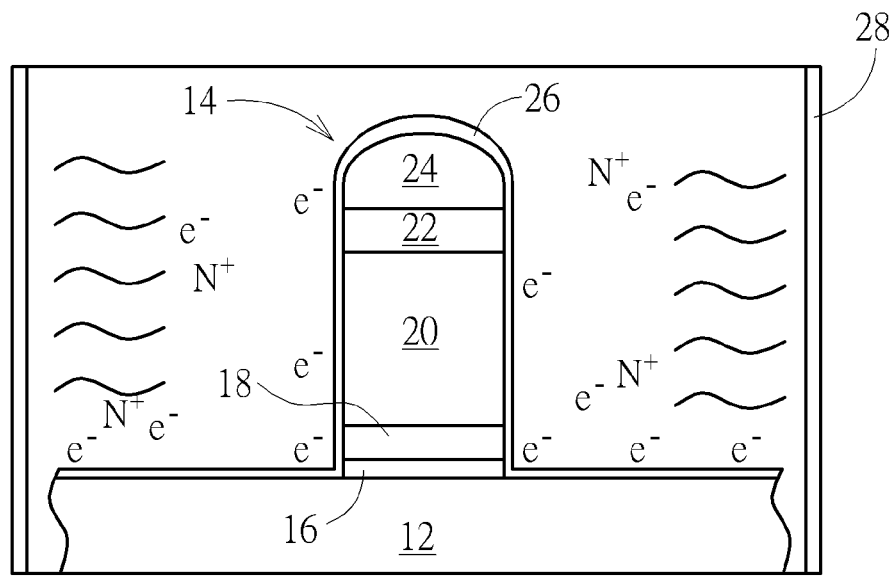
Figure 3:
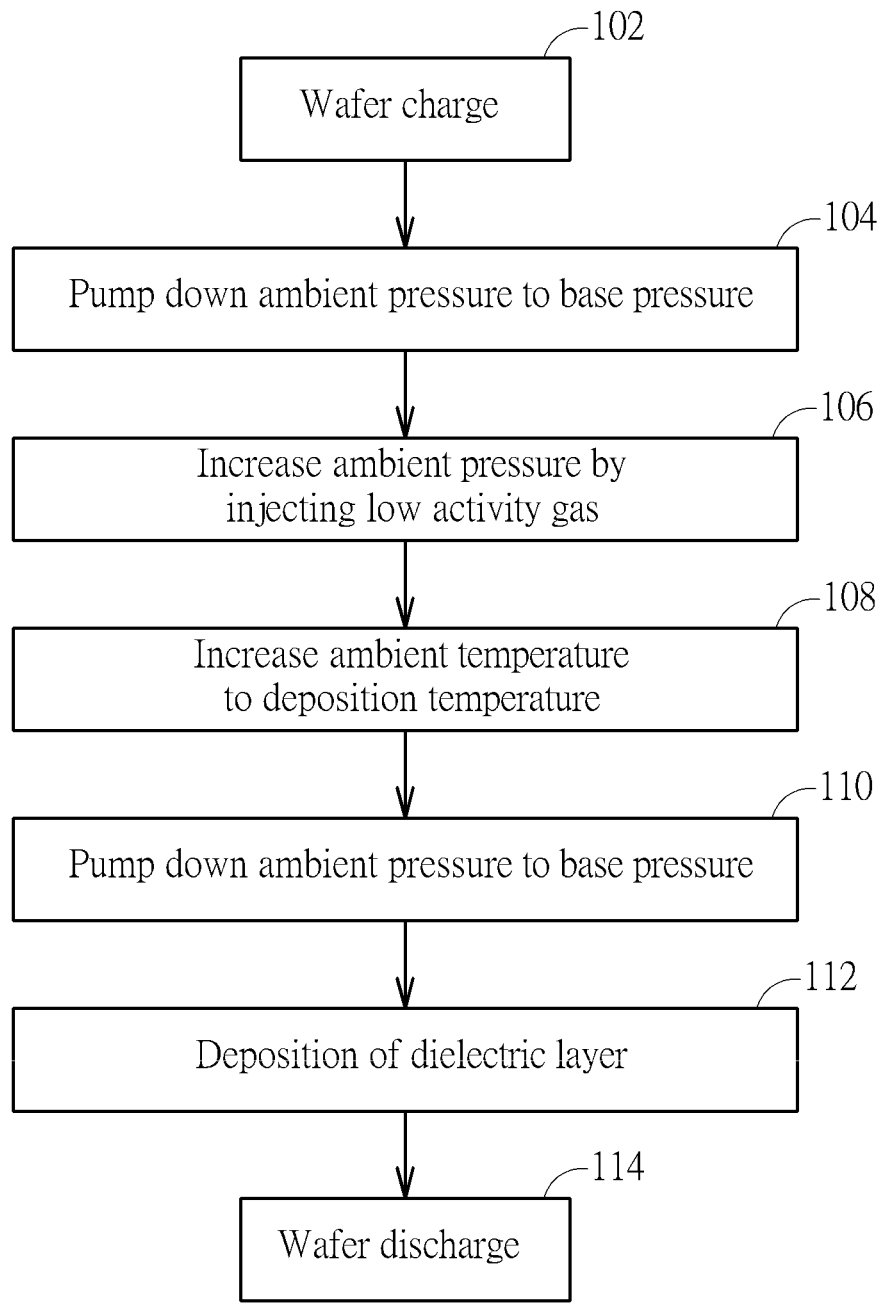

After the wet clean is conducted, as shown in FIGS. 2-3, the substrate 12 is charged to a furnace 28 for various pressure and temperature treatments, in which FIG. 2 illustrates a perspective view of the semiconductor device during the treatments and FIG. 3 is a flow chart diagram illustrating the treatments conducted after charging the substrate 12 into the furnace 28. First, in step 102, the substrate 12 is charged to the furnace 28 for pressure and temperature treatment, in which the temperature of the furnace 28 is controlled at around 400° C., but not limited thereto.

Next, in step 104, ambient pressure around the gate structure 14 is reduced to a base pressure, in which the base pressure is preferably less than 0.1 Torr.

Next, in step 106, ambient pressure around the gate structure 14 is increased to a predetermined pressure by injecting a low activity gas. According to a preferred embodiment of the present invention, the predetermined pressure is between 10-760 Torr, and more preferably between 50-200 Torr, and the injected low activity gas is selected from the group consisting of nitrogen gas, argon and helium.

Next, in step 108, ambient temperature around the gate structure 14 is increased at a speed of 5-20° C./min from 400°

C. to a deposition temperature, in which the deposition temperature is between 500-750° C. It should be noted that even though the ambient temperature is preferably increased after increasing the ambient pressure to the predetermined pressure as in step 106, the ambient temperature around the gate structure 14 could also be increased at the same time while the ambient pressure is increased. In other words, the actions of increasing ambient temperature to a range between 500-750° C. and increasing ambient pressure to a range between 10-760 Torr or between 50-200 Torr could be carried out simultaneously, which is also within the scope of the present invention.

Next, in step 110, ambient pressure is reduced to base pressure again while low activity gas is purged out from the furnace 28, in which the base pressure is preferably less than 0.1 Torr.

Figure 4:
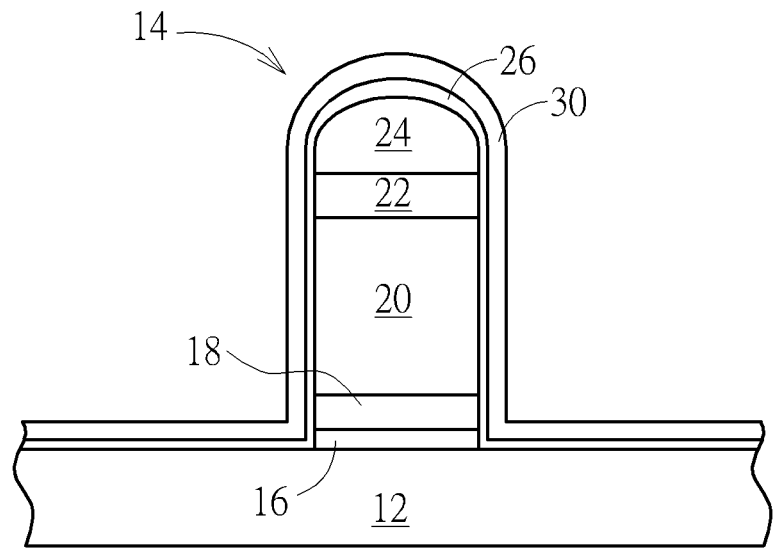

Next, in step 112 and as shown in FIG. 4, a dielectric layer 30 is formed on the substrate 12 and gate structure 14 after returning the ambient pressure to base pressure, and in step 114, the substrate 12 is discharged from the furnace 28. Preferably, the formation of the dielectric layer 30 is accomplished by conducting a chemical vapor deposition (CVD) process or atomic layer deposition (ALD) process, and the dielectric layer 30 is selected from the group consisting of silicon nitride, silicon oxide, and silicon carbon nitride.

Figure 5:
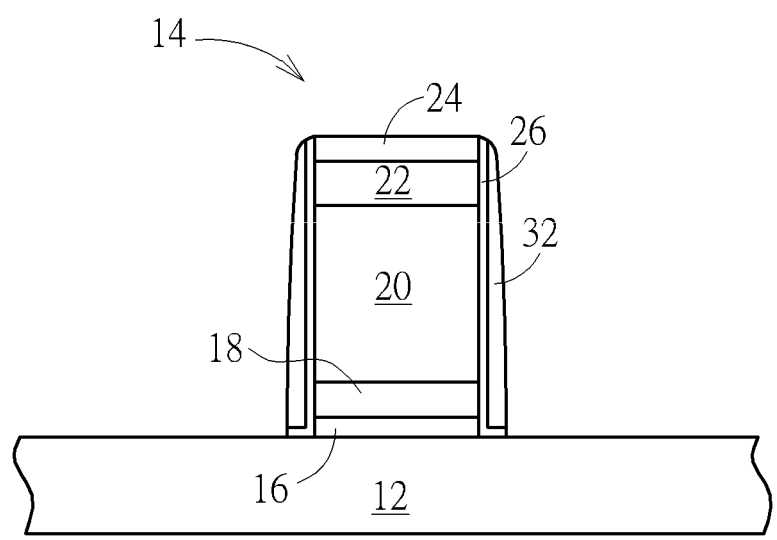

As shown in FIG. 5, the dielectric layer 30 is then etched back for forming a spacer 32 around the gate structure 14. Depending on the demand of the process, formation of elements including lightly doped drain, additional spacers, source/drain region, epitaxial layer, silicides, and contact etch stop layer and replacement metal gate (RMG) process could be conducted thereafter to complete the fabrication of a metal gate transistor, and as these processes are well known to those skilled in the art, the details of which are not explained in for the sake of brevity. This completes the fabrication of a semiconductor device according to a preferred embodiment of the present invention.

Overall, the present invention inserts a step of increasing ambient pressure around the gate structure by introducing low activity gas between pumping down ambient pressure to base pressure after charging wafer into furnace and ramping up ambient temperature to deposition temperature. Preferably, by increasing ambient pressure around the gate structure with injection of low activity gas before deposition of dielectric layer for forming spacer, charges generated on the surface of gate structure and substrate could be neutralized significantly and exposed surfaces of the silicon layer and high-k dielectric layer from gate structure as well as substrate could also be repaired by the introduction of low activity gas. As a result, current leakage of the device is improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having gate structure thereon, wherein the gate structure comprises a high-k dielectric layer;
   increasing an ambient pressure around the gate structure to a predetermined pressure by injecting a first gas in a furnace;
   increasing an ambient temperature around the gate structure in the furnace after increasing the ambient pressure to the predetermined pressure;
   reducing the ambient pressure to a base pressure in the furnace; and
   forming a spacer around the gate structure.

2. The method of claim 1, further comprising reducing the ambient pressure to the base pressure before increasing the ambient pressure around the gate structure.

3. The method of claim 2, wherein the base pressure is less than 0.1 Torr.

4. The method of claim 1, wherein the first gas comprises a low activity gas.

5. The method of claim 4, wherein the low activity gas is selected from the group consisting of nitrogen gas, argon and helium.

6. The method of claim 1, wherein the predetermined pressure is between 10-760 Torr.

7. The method of claim 1, wherein the predetermined pressure is between 50-200 Torr.

8. The method of claim 1, further comprising increasing the ambient temperature around the gate structure while increasing the ambient pressure.

9. The method of claim 1, wherein the ambient temperature is increased from 400° C. to a deposition temperature.

10. The method of claim 9, wherein the deposition temperature is between 500-750° C.

11. The method of claim 10, wherein the ambient temperature is increased at a speed of 5-20° C./min.

12. The method of claim 1, further comprising reducing the ambient pressure to the base pressure after increasing the ambient pressure around the gate structure and after increasing the ambient temperature.

13. The method of claim 12, further comprising:
   forming a dielectric layer on the substrate and the gate structure after reducing the ambient pressure to the base pressure;
   etching back the dielectric layer to form the spacer around the gate structure.

14. The method of claim 13, wherein the dielectric layer comprises silicon nitride, silicon oxide, or silicon carbon nitride.

15. The method of claim 13, further comprising performing a chemical vapor deposition (CVD) process or performing an atomic layer deposition (ALD) process for forming the dielectric layer.

16. The method of claim 1, further comprising:
   forming a native oxide on the substrate and the gate structure along with electron charges; and
   increasing the ambient pressure around the gate structure to a predetermined pressure by injecting a first gas to remove the electron charges.

17. The method of claim 1, further comprising reducing the ambient pressure to a base pressure by purging off the first gas.

* * * * *